US010312392B2

(12) United States Patent
Noemayr et al.

(10) Patent No.: US 10,312,392 B2
(45) Date of Patent: Jun. 4, 2019

(54) MULTI-JUNCTION SOLAR CELL FOR SPACE APPLICATIONS

(75) Inventors: Christel Noemayr, Munich (DE); Claus Zimmermann, Munich (DE)

(73) Assignee: Airbus Defence and Space GmbH, Taufkirchen (DE)

(*) Notice: Subject to any disclaimer, the term of this patent is extended or adjusted under 35 U.S.C. 154(b) by 717 days.

(21) Appl. No.: 13/073,663

(22) Filed: Mar. 28, 2011

(65) Prior Publication Data

US 2011/0232733 A1 Sep. 29, 2011

(30) Foreign Application Priority Data

Mar. 29, 2010 (EP) ..................... 10003359

(51) Int. Cl.
*H01L 31/048* (2014.01)
*H01L 31/041* (2014.01)
(Continued)

(52) U.S. Cl.
CPC .......... *H01L 31/048* (2013.01); *H01L 31/041* (2014.12); *H01L 31/0725* (2013.01); *H01L 31/02168* (2013.01); *H01L 31/022425* (2013.01); *H01L 31/0443* (2014.12); *H01L 31/0481* (2013.01); *H01L 31/0687* (2013.01); *H01L 31/072* (2013.01);
(Continued)

(58) Field of Classification Search
CPC ............... H01L 31/0687; H01L 31/072; H01L 31/0725; H01L 31/0735; H01L 31/074; H01L 31/041; Y02E 10/50
USPC ....................................................... 136/255
See application file for complete search history.

(56) References Cited

U.S. PATENT DOCUMENTS 4,093,473 A * 6/1978 Lindmayer ................. 136/251
4,293,732 A * 10/1981 Rancourt et al. ............. 136/257
(Continued)

FOREIGN PATENT DOCUMENTS

JP 04015961 A * 1/1992 .................. 136/252
JP 6-177412 A 6/1994
(Continued)

OTHER PUBLICATIONS

Corresponding European Search Report dated Nov. 11, 2010 (Four (4) pages).
(Continued)

*Primary Examiner* — Tamir Ayad
(74) *Attorney, Agent, or Firm* — Crowell & Moring LLP

(57) ABSTRACT

A multi-junction solar cell includes a first main surface and a second main surface opposite to the first main surface of a semiconductor body. A topmost pn-junction of a plurality of pn-junctions stacked on top of each other adjoins to the first main surface. A cell edge of the semiconductor body defines a shape of the first and the second main surfaces. An encapsulant on the first main surface provides an environmental protection of the semiconductor body. A mesa groove is provided on the first main surface and penetrates at least the topmost pn-junction. The mesa groove is located adjacent to the cell edge and is created around the circumference of the semiconductor body for providing an inner cell area and a mesa wall, the mesa wall being created between the mesa groove and the cell edge. The mesa groove is filled with the encapsulant.

18 Claims, 4 Drawing Sheets

(51) Int. Cl.
*H01L 31/0725* (2012.01)
*H01L 31/072* (2012.01)
*H01L 31/074* (2012.01)
*H01L 31/0216* (2014.01)
*H01L 31/0224* (2006.01)
*H01L 31/0443* (2014.01)
*H01L 31/0687* (2012.01)
*H01L 31/0735* (2012.01)

(52) U.S. Cl.
CPC ........ *H01L 31/074* (2013.01); *H01L 31/0735* (2013.01); *Y02E 10/50* (2013.01)

(56) References Cited

U.S. PATENT DOCUMENTS

| | | | |
|---|---|---|---|
| 6,194,651 B1* | 2/2001 | Stark et al. | 136/256 |
| 6,294,722 B1 | 9/2001 | Kondo et al. | |
| 6,380,478 B1* | 4/2002 | Yamamoto | H01L 31/048 136/244 |
| 2003/0134048 A1 | 7/2003 | Shiotsuka et al. | |
| 2004/0018664 A1* | 1/2004 | Guha | 438/113 |
| 2005/0081910 A1* | 4/2005 | Danielson et al. | 136/255 |
| 2007/0107772 A1* | 5/2007 | Meck et al. | 136/255 |
| 2008/0000523 A1* | 1/2008 | Hilgarth | H01L 31/0475 136/255 |
| 2009/0014069 A1* | 1/2009 | Chan | 136/259 |
| 2009/0032098 A1 | 2/2009 | Lu | |
| 2009/0142880 A1* | 6/2009 | Weidman et al. | 438/98 |
| 2009/0165851 A1* | 7/2009 | Sekimoto et al. | 136/256 |
| 2009/0229653 A1* | 9/2009 | Lu et al. | 136/249 |
| 2009/0320917 A1 | 12/2009 | Chan et al. | |
| 2010/0101628 A1* | 4/2010 | Poe et al. | 136/244 |
| 2010/0116327 A1* | 5/2010 | Cornfeld | 136/255 |
| 2010/0132792 A1* | 6/2010 | Kim et al. | 136/258 |
| 2010/0163099 A1* | 7/2010 | Hayes et al. | 136/251 |
| 2010/0243038 A1* | 9/2010 | Kukulka | H01L 27/1421 136/255 |

FOREIGN PATENT DOCUMENTS

| | | |
|---|---|---|
| JP | 7-122770 A | 5/1995 |
| JP | 7-202241 A | 8/1995 |
| JP | 9-307127 A | 11/1997 |
| JP | 2000-252505 A | 9/2000 |
| JP | 2003-249671 A | 9/2003 |
| JP | 2004-281831 A | 10/2004 |
| JP | 2006-41168 A | 2/2006 |

OTHER PUBLICATIONS

Japanese Notice of Reasons for Rejection with English translation dated Dec. 18, 2012 (six (6) pages).

* cited by examiner

US 10,312,392 B2

MULTI-JUNCTION SOLAR CELL FOR SPACE APPLICATIONS

CROSS REFERENCE TO RELATED APPLICATIONS

This application is a claims priority under 35 U.S.C. § 119 to European Patent Application No. 10 003 359.6-1528, filed Mar. 29, 2010, the entire disclosure of which is herein expressly incorporated by reference.

BACKGROUND AND SUMMARY OF THE INVENTION

The invention relates to a solar cell, especially a multi-junction solar cell with an amount of pn-junctions stacked on top of each other.

Solar cells are large area pn-junctions. In so-called multi-junction solar cell designs, several pn-junctions are stacked on top of each other such that the band gap of the semiconductor materials constituting the junctions decreases from the top to the bottom of the solar cell. Typically one to three pn-junctions are stacked on top of each other.

FIG. 1 shows a cross section through a state of the art triple junction (TJ) solar cell 14. A Germanium (Ge)-wafer 4, typically having a thickness of 100 to 200 µm, serves as the substrate of the cell. A pn-junction 3 is created, some micrometers from the wafer front surface by diffusion. On top of the wafer, two more pn-junctions 1, 2 are grown from III-V semiconductor materials. In this configuration the three pn-junctions are located within a depth of approximately 10 µm from the cell surface (first main surface 31 of the semiconductor body). With 32 a second main surface of the semiconductor body is indicated. At a cell edge 33, the pn-junctions are exposed to the environment (cf. reference numeral 5 indicating a side wall of a trench as a result of manufacturing process). Although the above mentioned dimensions are approximately four orders of magnitude smaller than the lateral extension of the solar cell (typically in the range of some centimeters), these open pn-junctions in the area outlined with reference numeral 5 are critical.

Any damage occurring across pn-junctions will have an adverse electrical effect. It is irrelevant whether the damage is mechanically, chemically by species of the environment attacking the cell edge or physically by diffusion of foreign atoms into the junction or by the creation of a conductive path along the cell edge 33. This damage created across the pn-junction 1, 2, 3 acts electrically like a local shunt and impacts the fill factor of the solar cell 14. The fill factor is a measure of how rectangular the so-called IV-curve of the cell is. In comparison, the same damage process occurring on the cell surface, e.g. on the top most n doped material of pn-junction 1 in FIG. 1, has a much smaller impact.

In addition, there are straightforward ways to passivate the top surface of the solar cell, e.g. by growth of appropriate semiconductor materials or oxides. However, such a passivation layer 6 is not possible at the cell edge 33. A contact grid 7 made from metal is located on the passivation layer 6, sometimes with an additional semiconductor layer underneath (cap layer). Sometimes the contact grid 7 is referred to as frontside grid. A contact pad 8 is created as part of the contact grid 7. Furthermore, an antireflection coating 9 is applied on top of the passivation layer 6 and the contact grid 7, respectively.

To separate the solar cell from unwanted areas of the wafer 4, the wafer is mechanically cut. In order to prevent mechanical damage at the edge of the pn-junctions with the detrimental effects outlined above, a trench is etched into the wafer 4 to a certain depth around the circumference of the solar cell. This trench is typically termed "mesa groove". It has a depth of approximately 10 µm in the case of the solar cell of FIG. 1. Together with the mechanical cut represented by the edge 10 of the wafer 4, a small step 11 at the edge of the cell is created. As shown in FIGS. 3, 5 and 6, a depth of the mesa groove 19 may be greater than a depth of step 11 which is disposed adjacent to the sidewall 5 of the mesa wall 20. The open pn-junctions ending at the sidewall 5 of the trench are free from sawing damage. This process is state of the art in III-V solar cell technology.

Individual solar cells as described above are interconnected in series and in parallel to form a solar cell module which provides the desired voltage and current for a particular application. A series interconnection of three solar cells with individually encapsulated cells is shown in FIG. 2. The principle illustrated in the sectional view is typical for solar arrays for space use. Since the structure of the three solar cells is identical, the following description only refers to the solar cell 14 shown in the middle.

As environmental protection, the solar cells are usually enclosed in a transparent encapsulant and equipped with a glass sheet as common front surface. There are cases, where a common encapsulation of all solar cells is not possible, most notably if the solar cells are exposed to large temperature fluctuations while bonded 12 to a substrate 13 with a large thermal expansion mismatch. Solar cells on a solar array for space are an example for this situation. Therefore, each solar cell 14 is equipped with its own coverglass 15 with the help of a transparent, non-conductive adhesive 16. While the coverglass 15 typically is made from a 100 µm thick Cerium doped microsheet, the non-conductive adhesive 16 has a thickness of around 20 µm. For space arrays typically silicones are used as transparent encapsulants, for example DC93-500 from Dow Corning, RTV-S690 from Wacker or CV16-2500 from Nusil. Individual cells 14 are connected in series by a cell interconnector 17, for instance a metal stripe. The cell interconnector 17 connects a contact grid and a contact pad 8, respectively, of one solar cell 14 with a backside metallization 18 of the neighbouring solar cell. In this configuration, the pn-junctions ending at the side wall 5 of a mesa groove at the cell edge 33 remain exposed to the environment. The non-conductive adhesive 16 is typically not intended to protrude further into the inter cell gap to avoid adverse effects on the fatigue behaviour of the cell to cell interconnectors 17.

U.S. Patent Application Publication No. 2009/0320917 A1, however, discloses the possibility to passivate and protect the cell edge by the encapsulant itself.

Exemplary embodiments of the present invention provide a solar cell, especially a multi-junction solar cell, for space applications, comprising an improved edge protection.

In accordance with the present invention, a solar cell, particularly a multi-junction solar cell, comprises a first main surface and a second main surface opposite to the first main surface of a semiconductor body wherein a topmost pn-junction of an amount of pn-junctions stacked on top of each other adjoins to the first main surface. The solar cell may comprise only one pn-junction or a plurality of pn-junctions. Typically, a solar cell comprises between one and three pn-junctions. The solar cell according to the invention can be, in particular, a triple junction solar cell for space applications.

The solar cell further comprises a cell edge of the semiconductor body defining a shape of the first and the second main surfaces and thus the solar cell. The cell edge of the semiconductor body may be stepped or plane.

The solar cell further comprises an encapsulant provided on the first main surface for providing an environmental protection of the semiconductor body. The encapsulant may be a transparent, non-conductive adhesive.

Furthermore, a mesa groove is provided on the first main surface and penetrating at least the topmost pn-junction, wherein the mesa groove is located adjacent to the cell edge and created around the circumference of the semiconductor body for providing an inner cell area and a mesa wall. The mesa wall is created between the mesa groove and the cell edge. The mesa groove is filled with the encapsulant.

The mesa wall serves as an edge protection and as an environmental protection for the inner cell area. Due to the mesa groove being located adjacent to the cell edge and created around the circumference of the semiconductor body the active cell edge is not longer exposed to the environment and protected from mechanical, chemical or physical attacks.

The mesa groove according to the invention may therefore be called an inner mesa groove which separates the semiconductor body in an inner cell area and a mesa wall adjoining to the cell edge with its wall being on the opposite side of the inner cell area. This area of the mesa wall is part of the cell edge which might be stepped due to an outer trench etched into the wafer primary before the wafer is mechanically cut into single solar cells. However, this area of the mesa wall which still is exposed to the environment is not an active part of the solar cell. Manufacturing of a solar cell may be made with known technologies without the need to change manufacturing steps.

According to an exemplary embodiment, the inner cell area is completely, i.e. continuously, surrounded by the (inner) mesa groove.

In a further exemplary embodiment all pn-junctions of the amount of pn-junctions are penetrated by the (inner) mesa groove so that the mesa wall is electrically isolated from the inner cell area. This has the advantage that the active, inner cell area is electrically isolated by the mesa groove and the encapsulant from the cell edge.

According to a further exemplary embodiment the mesa wall is at each depth of the mesa groove mechanically attached to the inner cell area. With this embodiment the maximum depth of the mesa groove is specified. In a triple junction solar cell having three pn-junctions a depth of 10 to 20 µm is sufficient because a bulk of the wafer of the solar cell adjoining to the second main surface is not electrically active. The width of the mesa wall is determined by a trade off between manufacturability and loss in active cell area. It will be understood that the mesa wall has to have sufficient strength to be self-supporting.

According to a further exemplary embodiment the width of the mesa groove is chosen dependent on the viscosity of the material of the encapsulant. In one design, where the encapsulant is meant to fill the mesa groove completely, the minimum width of the mesa groove depends on the viscosity of the encapsulant. In an alternative embodiment the maximum width of the groove is chosen so small that the encapsulant does not fill the trench before it is cured. Both alternative design variations provide a complete encapsulation of the pn-junctions adjoining the (inner) mesa groove from environmental attacks.

According to a further embodiment, the width of the mesa wall is adjusted in its dimensions for blocking UV (ultraviolet) radiation from side if the solar cell is operated under inclined conditions.

According to a further exemplary embodiment the material of the encapsulant is non-conductive.

According to a further exemplary embodiment a contact grid is provided on the first main surface of the semiconductor body only within the inner cell area. It is to be noted that the contact grid is not provided on top of the mesa wall.

Furthermore, a non-conductive antireflection coating may be provided on the inner cell area covering the contact grid and on the top of the mesa wall.

According to a further preferred embodiment a coverglass is located on the encapsulant for sealing the solar cell and the mesa groove on the first main surface. It is apparent to a person skilled in the art that the coverglass will be located on the encapsulant before a plurality of solar cells has been bonded to a substrate.

Preferably, the coverglass comprises an UV blocking filter for preventing photodegradation of the encapsulant in the groove.

According to a further embodiment the cell edge exposed to environment is coated with a non-UV transparent material around the entire cell circumference.

According to a further embodiment a conductive or antistatic material for providing an electrical shunt path is applied on the cell edge which extends between a back side of the solar cell and a front side of a solar cell, the back side being provided by the second main surface and the front side being provided by the coverglass, thereby at least contacting the encapsulant and, the mesa wall. The conductive or antistatic material may be a coating, a paint or a film. The aim of the conductive or antistatic material is to reduce or prevent the build-up of electric charge on the coverglass and thus to guard against electrostatic discharge (ESD). The conductive or antistatic material may be applied at only one position at the cell edge. For example, cropped corners are an ideal location since the distance to neighbouring solar cells on an array or solar module is the largest.

Other objects, advantages and novel features of the present invention will become apparent from the following detailed description of one or more preferred embodiments when considered in conjunction with the accompanying drawings.

BRIEF DESCRIPTION OF THE DRAWINGS

The invention will be described in more detail by reference to the figures.

DETAILED DESCRIPTION OF THE DRAWINGS

Figure 3:
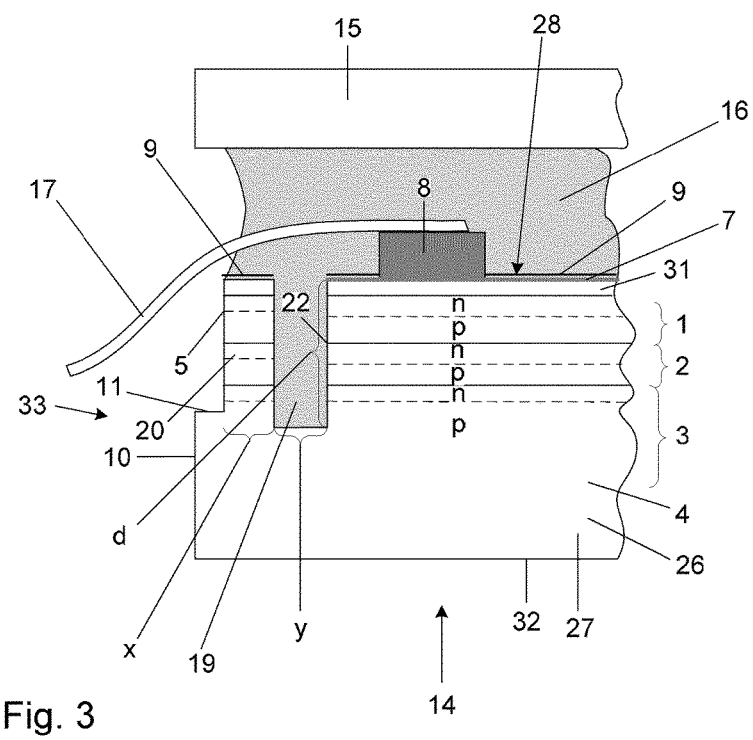
FIG. 3 shows a cross sectional view through a triple junction solar cell according to the invention.

FIG. 3 shows a cross sectional view of a triple junction solar cell 14 according to the invention. It is to be noted that neither the Ge wafer nor the amount of pn-junctions shown in the examples are relevant for the principle of the invention. The triple junction solar cell has only been chosen by means of example. It further has to be noted that the vertical dimensions shown in the figures are not to scale. Furthermore, the lateral dimensions are not to scale and/or are not shown completely. The cell structure serves illustration purposes only. The invention is not limited to this particular cell type or geometry.

Figure 1:
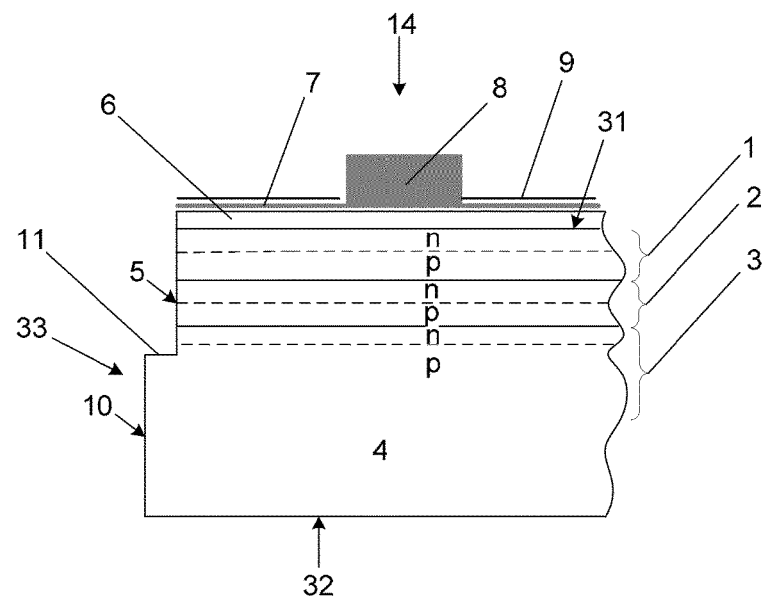
FIG. 1 shows a cross sectional view through an already described state of the art triple junction solar cell.
Figure 2:
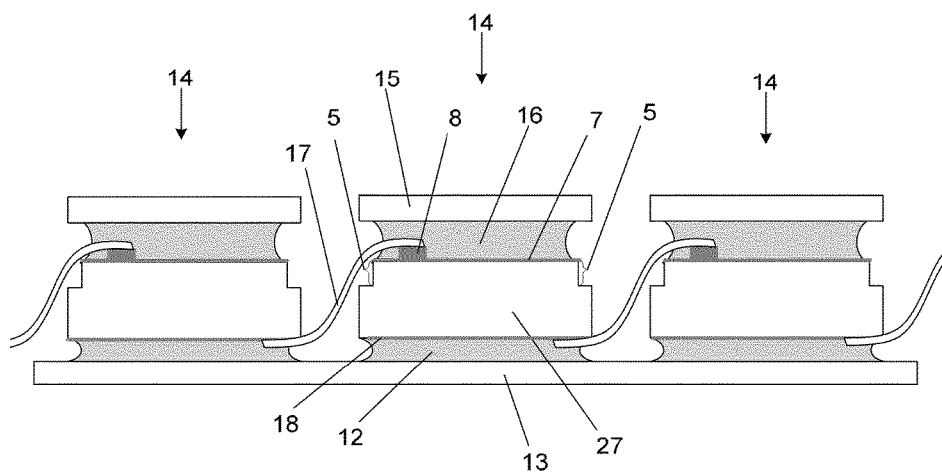
FIG. 2 shows a schematically side view of a series interconnection of solar cells, known from the prior art and already described.

The solar cell design according to the invention provides protection of an active cell edge from the environment. The cell design is based on the structure which has been described with reference to FIG. 1. A Germanium-wafer 4 which typically is 100 to 200 μm thick serves as the substrate of a cell. Some micrometers from the wafer front surface a pn-junction 3 is created by diffusion. On top of the wafer 4, two more pn-junctions 1 and 2 are grown from III-V semiconductor materials. The topmost pn-junction 1 adjoins to a first main surface 31, while the backside of the wafer 4 being opposite to the pn-junctions adjoins to a second main surface 32. In this example the three pn-junctions 1, 2, 3 are located within a depth of approximately 10 μm from the first main surface 31. The wafer 4 together with the pn-junctions stacked on top of each other is called a semiconductor body 27. The semiconductor body 27 comprises a cell edge 33 which defines an outer shape of the first and the second main surfaces 31, 32 and thus the solar cell 14.

During manufacturing unwanted areas of the wafer 4 are removed by mechanically cutting. In order to prevent mechanical damage at the edges of the pn-junctions in the region of the cell edge 33 a trench, typically termed "mesa groove", is etched into the wafer to a certain depth around the circumference of the later semiconductor body 27 prior to mechanical cutting. The depth of the trench is approximately 10 μm in case of a triple junction solar cell. Due to these manufacturing steps the cell edge 33 consists of an edge 10 of the wafer 4, a small step 11 and an outer side wall 5 of the trench or mesa groove.

The outer side wall 5 (i.e., the edges of pn-junctions 1, 2, 3) are exposed to the environment. Any damage occurring across the edges of the pn-junctions 1, 2, 3 will result in an adverse electrical effect and it is irrelevant whether the damage is mechanically, chemically by species in the environment attacking the cell edge or physically by diffusion of foreign atoms into the junctions or by the creation of a conductive path along the cell edge 33 and the outer side wall 5, respectively. The damage created across the pn-junctions 1, 2, 3 acts electrically like a local shunt and impacts the fill factor of the solar cell.

To protect the edges of the pn-junctions 1, 2, 3 of the semiconductor body 27, a mesa groove 19 provided on the first main surface and penetrating at least the topmost pn-junction is created. The mesa groove 19 is located adjacent to the cell edge 33 and created around the circumference of the semiconductor body 27 providing an inner cell area 28 and a mesa wall 20. Therefore, the mesa wall 20 is created between the mesa groove 19 and the cell edge 33. According to its position within the semiconductor body 27, the mesa groove 19 is an "inner" mesa groove.

The mesa groove 19 has a distance from the original cell edge that is defined by the width x of the mesa wall 20. The inner mesa groove 19 may be created, for example, by the same chemical etch process which is used to define the trench in the region of the original cell edge 33 as outlined above. Other processes to create this inner mesa groove are possible.

The depth d of the inner mesa groove 19 is such that it separates at least the topmost pn-junction 1 stacked on top of each other. Preferably, it separates all of the stacked pn-junctions. The maximum depth d is given by the requirement that the mechanical integrity of the semiconductor body is not affected. This means that the mesa wall 20 created by the inner mesa groove 19 is still attached mechanically to the inner cell area 28.

In the Germanium-based triple junction solar cell shown in FIG. 3, a depth d of 10 to 20 μm is sufficient since the bulk 26 of the Germanium-wafer 4 is not electrically active. The width y of the mesa groove 19 is not only determined by the technique used to create the inner mesa groove 19 but also by the viscosity of an encapsulant 16 that is provided on the first main surface 31 after a contact grid 7 and an antireflection coating 9 have been created on the first main surface 31 of the semiconductor body 27. The mesa groove can be created before or after forming the contact grid 7/8 and/or an antireflective coating 9.

In one exemplary design, the encapsulant 16 is intended to fill the mesa groove 19 completely. This requires a minimum width y depending on the viscosity of the encapsulant 16. In an alternate design, the maximum width y of the mesa groove 19 is chosen so small that the encapsulant does not fill the trench before it is cured. However, the latter design is not well-suited for applications in vacuum due to the trapped atmosphere. Both designs provide a complete encapsulation of the open pn-junctions 1, 2, 3 adjoining the inner mesa groove 19 from environmental attack. The edge protection of the active cell edge 22 within the mesa groove 19 is provided by the outer mesa wall 20 together with the encapsulant 16.

If further effects, like photo-degenerative processes described in the following, do not play a role, the distance x of the mesa groove 19 from a cell edge 33 is determined by a trade off between manufacturability and loss in active cell area. The width x of the mesa wall has to have sufficient strength to be self-supporting.

Figure 4:
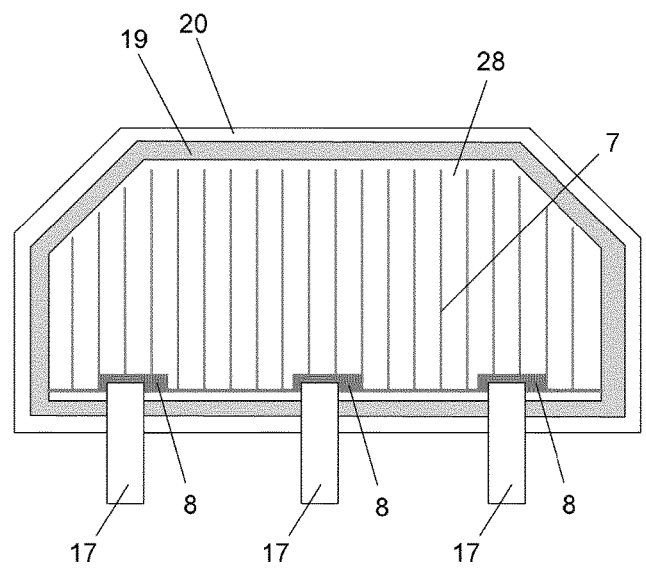
FIG. 4 shows a top view the solar cell according to the invention.

To ensure that the mesa wall 20 serves as an environmental protection for the inner cell area, it will be electrically isolated from the inner cell area 28. This mandates that the entire contact grid 7 is provided on the first main surface 31 of the semiconductor body 27 only within the inner cell area 28 but not on top of the mesa wall 20. This feature is illustrated in the top view of the solar cell 14 in FIG. 4. As can be seen from this figure, the mesa wall 20 and the mesa groove 19 are surrounding the inner cell area 28. The mesa wall 20 is separated from the inner cell area 28 through the mesa groove 19. On the top of the inner cell area 28 the contact grid 7 is provided. The contact grid 7 is electrically contacted with three cell interconnectors 17 (e.g. metal stripes) via contact pads 8. It will be understood by the person skilled in the art that the amount of contact pads 8 and cell interconnectors 17 can vary from the embodiment shown in FIG. 4.

The cell interconnectors 17 are prevented from touching the mesa wall by the non-conductive encapsulant 16 or the non-conductive antireflection coating 9 which are—as described—on top of the contact grid 7 within the inner cell area 28 and on top of the mesa wall 20. Thereby, an electrical reconnecting of the mesa wall 20 through the cell interconnectors can be prevented. The antireflection coating 9 may be made from materials like aluminium oxide. With the help of a cell design featuring an inner mesa groove 19, the mesa wall 20, together with the encapsulant 16, is used to protect the inner or active cell edge 22 from mechanical, chemical or physical attack.

One particular concern in some solar module application are photo-initiated processes at the active cell edge which require (short wave length) UV light. Space missions to the inner planets are an example for that. On those high-temperature, high-intensity missions, temperatures above 200° C. are combined with 10 or more times increased solar intensity. At these elevated temperatures, there is a significant outgassing from all polymeric materials surrounding the cell that can attack the open pn-junctions at the active cell edge if UV light is simultaneously present. The inventive cell design provides edge protection in this particular scenario as well.

A coverglass 15 which is located on the encapsulant 16 for sealing the solar cell 14 and the mesa groove 19 may be equipped with a UV blocking filter due to the fact that the transparent encapsulant might not be exempt from UV light induced degradation itself. This ensures that the mesa wall 20 still protects the inner cell edge 22.

Figure 5:
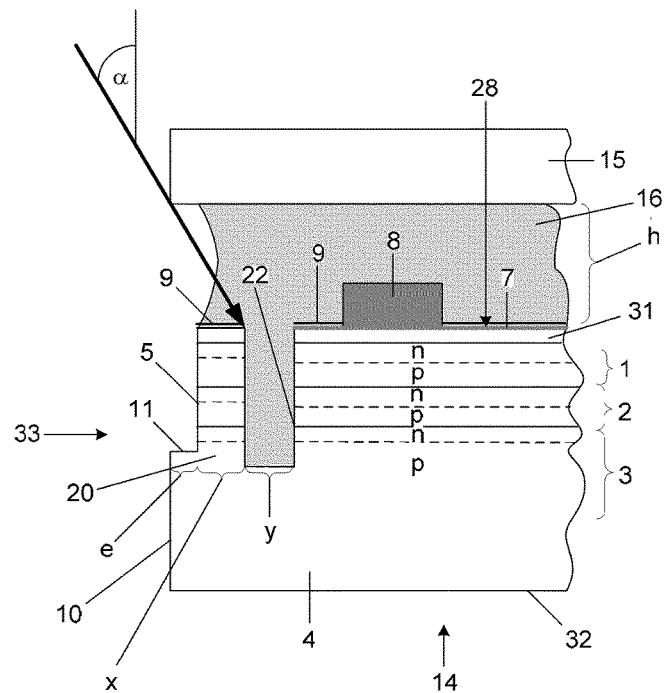
FIG. 5 shows the principle how to calculate the minimum width of a mesa wall being provided in a solar cell according to the invention.

Some operational scenarios make it necessary to tilt a solar array which consists of a plurality of in series and/or in parallel connected solar cells 14 away from normal illumination to a certain maximum angle α of incidence. In such a situation UV light can enter from the side as illustrated in the cross sectional view of the solar cell according to the invention in FIG. 5. To provide protection of the active or inner cell edge 22 with the cell design according to the invention, the width x of the mesa wall 20 has to be sufficiently large to provide shadowing up to the angle α. With the width e of step 11 of cell edge 33, the thickness h of encapsulant 16 the relation $\tan \alpha = (e+x)/h$ holds, from which the minimum thickness of the mesa wall 20 can be calculated for a given angle α. In an alternative embodiment for inclined operation the outer cell edge 33 (cell wall) is coated with a non-UV transparent material around the entire cell circumference.

The solar cell 14 with the additional mesa groove 19 filled with encapsulant provides increased resistance against electrostatic discharge (ESD) occurring for example on space solar arrays. The mesa wall 20 is still separated at maximum by the for ESD scenarios negligible operating voltage of the cell from the potential of the inner cell area 28. Any electrostatic discharge that might happen will occur at the outer cell edge but not within the mesa groove 19 filled with encapsulant 16. The adverse effects of such a primary arc notably by the creation of a conductive path at the cell edge are mitigated by the inventive cell design. The conductive path can no longer degrade the electrical cell performance since the mesa wall 20 is electrically decoupled from the cell.

One known possibility to prevent electrostatic discharge completely is to electrically ground the coverglass 15, if its bulk resistivity is sufficiently low or if it is equipped with a conductive coating like indium tin oxide (ITO), for example. The inventive cell design greatly simplifies these grounding operations because it is sufficient to apply a conductive or antistatic coating or paint or film etc. 25 at any position around the cell edge 33 without having to account for i) not contacting the open pn-junctions and ii) the chemical or physical compatibility with the cell material since the active cell edge 22 is completely protected by the mesa wall 20 and the encapsulant 16. For this application the depth d of the mesa groove 19 has to be sufficient to ensure that all pn-junctions 1, 2, 3 are separated from the cell edge 33.

Figure 6:
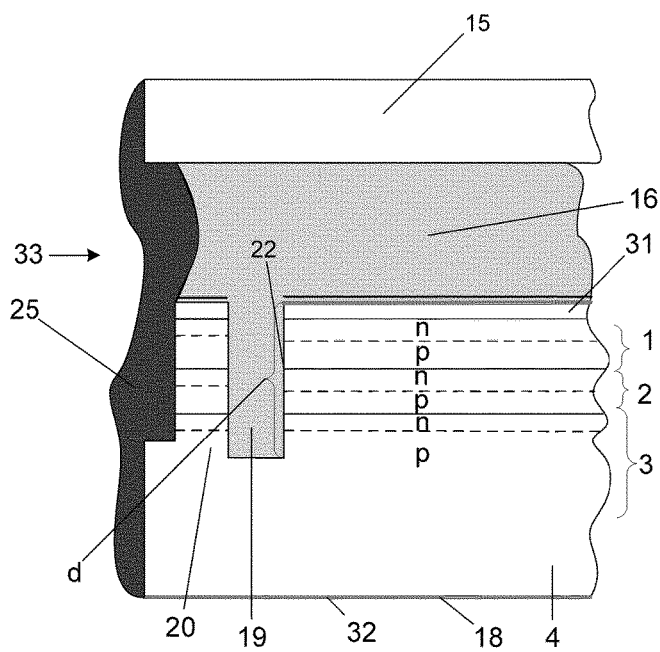
FIG. 6 shows a cross sectional view of a solar cell according to the invention being provided with an ESD protection.

The grounding of the coverglass 15 is illustrated in the cross sectional view of the solar cell according to the invention in FIG. 6. The material providing the conductive or antistatic path 25 is applied freely all over the cell edge connecting the coverglass 15 to a bulk 26 of the solar cell, i.e. the Germanium-wafer in case of the triple junction cell design, and/or a backside metallization 18 on the second main surface 32 of the semiconductor body. Unlike in state of the art designs, no care has to be taken to not contact the open pn-junctions adjoining the active cell edge 22.

Figure 7:
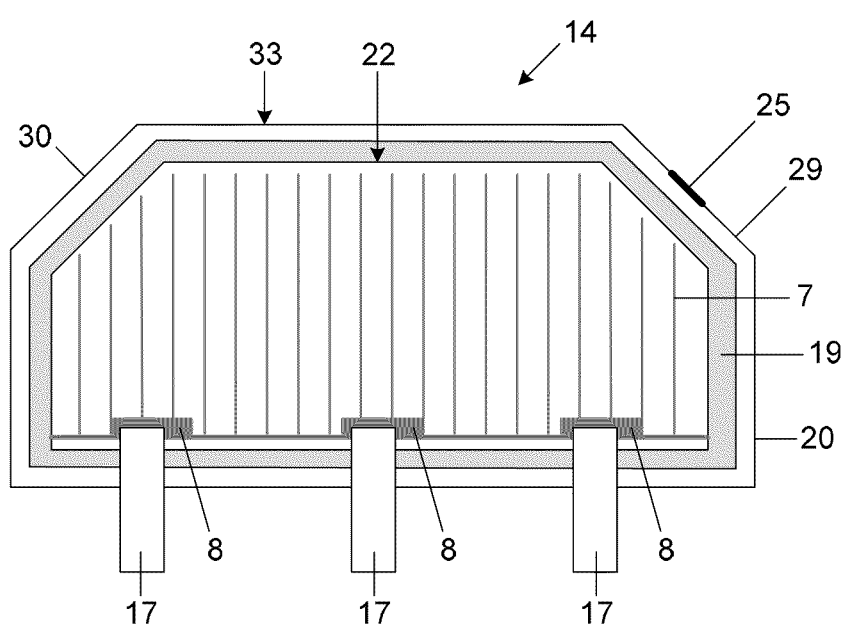
FIG. 7 shows a top view of a solar cell according to the invention illustrating a preferred position for ESD protection means.

The grounding operation has to be performed only at one position at the cell edge 33, but not around the entire outer cell circumference. For that matter, if the focus is only on the grounding operation for ESD purposes, the mesa groove 19 as well would not have to extend all the way around the cell circumference. Current triple junction space solar cells feature two cropped corners 29, 30 originating from the optimization of the circular shaped germanium-wafer they are grown on. These cropped corners 29, 30 might be chosen as a location for applying the conductive or antistatic material 25 that is applied, as illustrated in FIG. 7. On other locations around the circumference it has to be considered that no short circuit between adjacent solar cells can occur.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

LISTING OF REFERENCE NUMERALS 1 pn junction
2 pn junction
3 pn junction
4 wafer
5 side wall of trench
6 passivation layer
7 contact grid
8 contact pad
9 antireflection coating
10 edge of wafer
11 step of cell edge
12 bonding
13 substrate
14 solar cell
15 coverglass
16 encapsulant
17 cell interconnector
18 backside metallization
19 mesa groove
20 mesa wall
22 inner/active cell edge within the mesa groove 19
25 antistatic material/path
26 bulk of wafer
27 semiconductor body
28 inner cell area
29 cropped corner
30 cropped corner
31 first main surface
32 second main surface
33 cell edge
d depth of mesa groove 19
e width of step 11
h thickness of encapsulant 16
x width of mesa wall 20
y width of mesa groove 19
α angle of incidence

What is claimed is:

1. A multi junction solar cell, comprising:
a first main surface and a second main surface opposite to the first main surface of a semiconductor body, wherein a topmost pn-junction of a plurality of pn-junctions stacked on top of each other adjoins to the first main surface;
a cell edge of the semiconductor body defining a shape of the first and the second main surfaces;
an encapsulant arranged on the first main surface to protect the semiconductor body from an environment;
a mesa groove arranged on the first main surface, wherein the mesa groove is filled with the encapsulant, and
a coverglass is located on the encapsulant to seal the solar cell and the mesa groove on the first main surface,
wherein the mesa groove is located adjacent to the cell edge to provide an inner cell area and a mesa wall,
wherein a conductive or antistatic material that provides an electrical shunt path is applied on the cell edge which extends between a back side of the solar cell and a front side of the solar cell, the back side being provided by the second main surface and the front side being provided by the coverglass, thereby at least directly contacting the coverglass, the encapsulant, and the mesa wall.

2. The solar cell according to claim 1, wherein the mesa wall is, at each depth of the mesa groove, mechanically attached to the inner cell area.

3. The solar cell according to claim 1, wherein a width of the mesa groove is dependent on a viscosity of a material of the encapsulant.

4. The solar cell according to claim 1, wherein a width of the mesa wall is selected to block UV radiation from a side when the solar cell is operated under inclined conditions.

5. The solar cell according to claim 1, wherein a material of the encapsulant is non-conductive.

6. The solar cell according to claim 1, wherein a contact grid is arranged on the first main surface of the semiconductor body only within the inner cell area.

7. The solar cell according to claim 6, wherein a non-conductive antireflection coating is arranged on the inner cell area covering the contact grid and on the top of the mesa wall.

8. The solar cell according to claim 1, wherein the coverglass comprises an UV blocking filter for preventing photodegradation of the encapsulant within the groove.

9. The solar cell according to claim 1, wherein a width of the mesa wall is selected based on an expected angle of incidence of UV radiation.

10. The solar cell according to claim 1, wherein the cell edge is coated with a non UV transparent material around the entire cell circumference.

11. The solar cell according to claim 1, wherein the conductive or antistatic material is applied at only one position at the cell edge.

12. The solar cell according to claim 1, further comprising:
an additional mesa groove located between the mesa wall and the cell edge, wherein the mesa wall forms one side of the additional mesa groove and an opposing side of the additional mesa groove is exposed.

13. The solar cell according to claim 12, wherein a depth of the mesa groove is 10 to 20 μm and a depth of the additional mesa groove is approximately 10 μm.

14. The solar cell according to claim 1, wherein all pn-junctions of the plurality of pn-junctions are penetrated by the mesa groove so that the mesa wall is electrically isolated from the inner cell area.

15. The solar cell according to claim 1, wherein the second main surface is a semiconductor material that forms part of a bottommost pn-junction and forms a contiguous common base of the inner cell area and the mesa wall.

16. The solar cell according to claim 1, wherein the mesa groove completely surrounds a circumference of the semiconductor body.

17. The solar cell according to claim 1, wherein the mesa wall completely surrounds a circumference of the inner cell area.

18. The solar cell according to claim 1, wherein the conductive or antistatic material comprises a conductive or antistatic coating or paint or film.

* * * * *